(12) United States Patent
Kamimaru

(10) Patent No.: US 8,531,230 B2
(45) Date of Patent: Sep. 10, 2013

(54) INPUT CIRCUIT

(71) Applicant: Renesas Electronics Corporation, Kanagawa (JP)

(72) Inventor: Dai Kamimaru, Yokohama (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/658,347

(22) Filed: Oct. 23, 2012

(65) Prior Publication Data
US 2013/0099847 A1 Apr. 25, 2013

(30) Foreign Application Priority Data

Oct. 24, 2011 (JP) ................................. 2011-232899

(51) Int. Cl.
H03L 5/00 (2006.01)
(52) U.S. Cl.
USPC ........... 327/333; 326/68; 326/81; 365/189.11
(58) Field of Classification Search
USPC ................. 327/333, 309, 315, 318, 324, 327; 326/62–71, 73–81; 365/189.11
See application file for complete search history.

(56) References Cited

U.S. PATENT DOCUMENTS
6,462,602 B1 * 10/2002 Potter ........................... 327/333

FOREIGN PATENT DOCUMENTS
JP 2006-114733 A 4/2006
JP 2009-77016 A 4/2009
TW 201242252 * 10/2012

* cited by examiner

Primary Examiner — Long Nguyen
Assistant Examiner — Thomas Skibinski
(74) Attorney, Agent, or Firm — Foley & Lardner LLP

(57) ABSTRACT

An input circuit includes an inverter, a first path control circuit and a second path control circuit. An input of the inverter is connected with a first node. A target inversion potential is higher than an inversion potential of the inverter. The first path control circuit electrically connects an input terminal and the first node when the input potential is higher than the target inversion potential, and blocks off an electrical connection between the input terminal and the first node when the input potential is lower than the target inversion potential. The second path control circuit electrically connects a ground terminal and the first node when the input potential is lower than a second inversion potential which is lower than the target inversion potential and blocks off the electrical connection between the ground terminal and the first node when the input potential is higher than the second inversion potential.

7 Claims, 8 Drawing Sheets

Fig. 4

|   | IN=Low (0V) | | | IN=High (VCCH) | | |
|---|---|---|---|---|---|---|
|   | Vgd | Vgs | Vds | Vgd | Vgs | Vds |
| P10 | VREFP | VREFP | 0 | VCCH-VREFP | VCCH-VREFP | 0 |
| N10 | VCCL | VCCL | 0 | VCCH-VCCL | Vtn | VCCH-(VCCL-Vtn) |
| N20 | VCCL | VCCL | 0 | VCCH-VCCL | Vtn | VCCH-(VCCL-Vtn) |
| P22 | VCCL | VCCL | VCCL | VCCL-Vtn | Vtn | VCCL |
| N22 | VCCL | 0 | 0 | VCCL-Vtn | VCCL-Vtn | 0 |
| N24 | VCCL | VCCL | 0 | VCCL-Vtn | 0 | VCCL-Vtn |
| P30 | VCCL | VCCL | VCCL | VCCL-Vtn | Vtn | VCCL |
| N30 | VCCL | 0 | 0 | VCCL-Vtn | VCCL-Vtn | 0 |

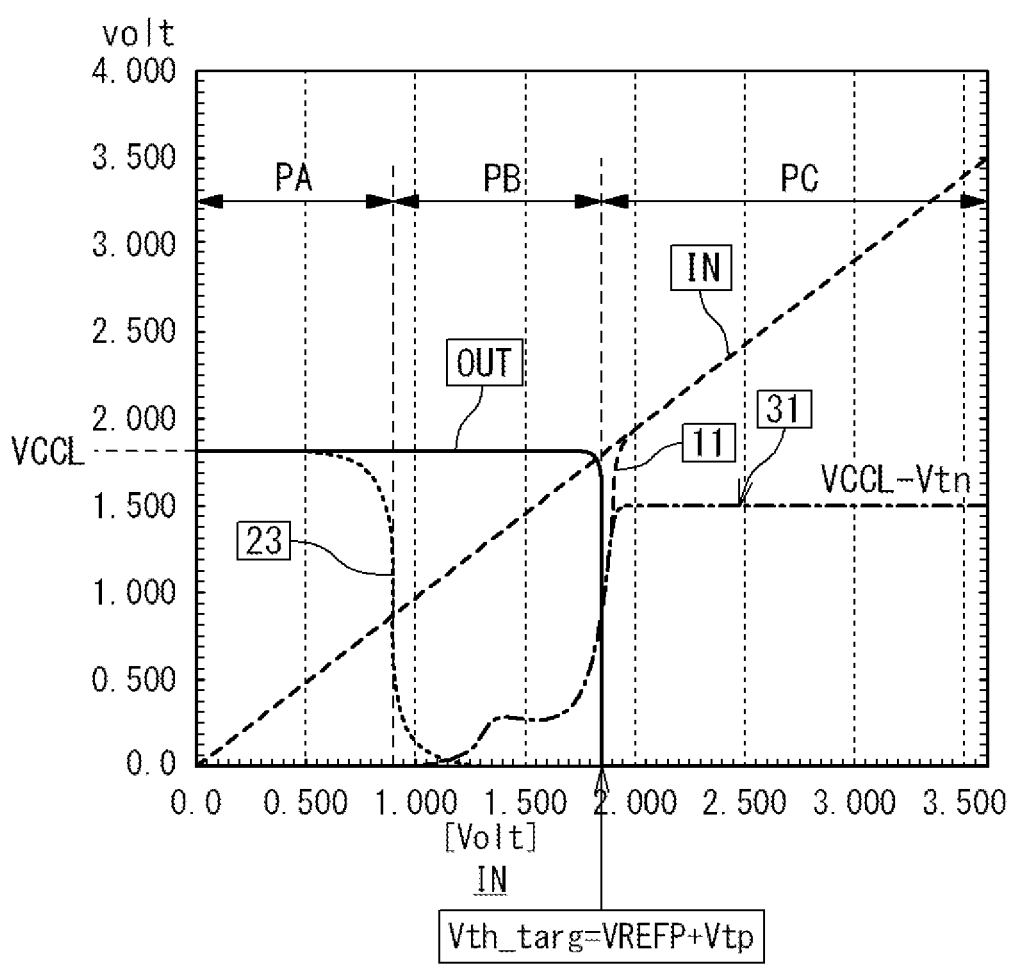

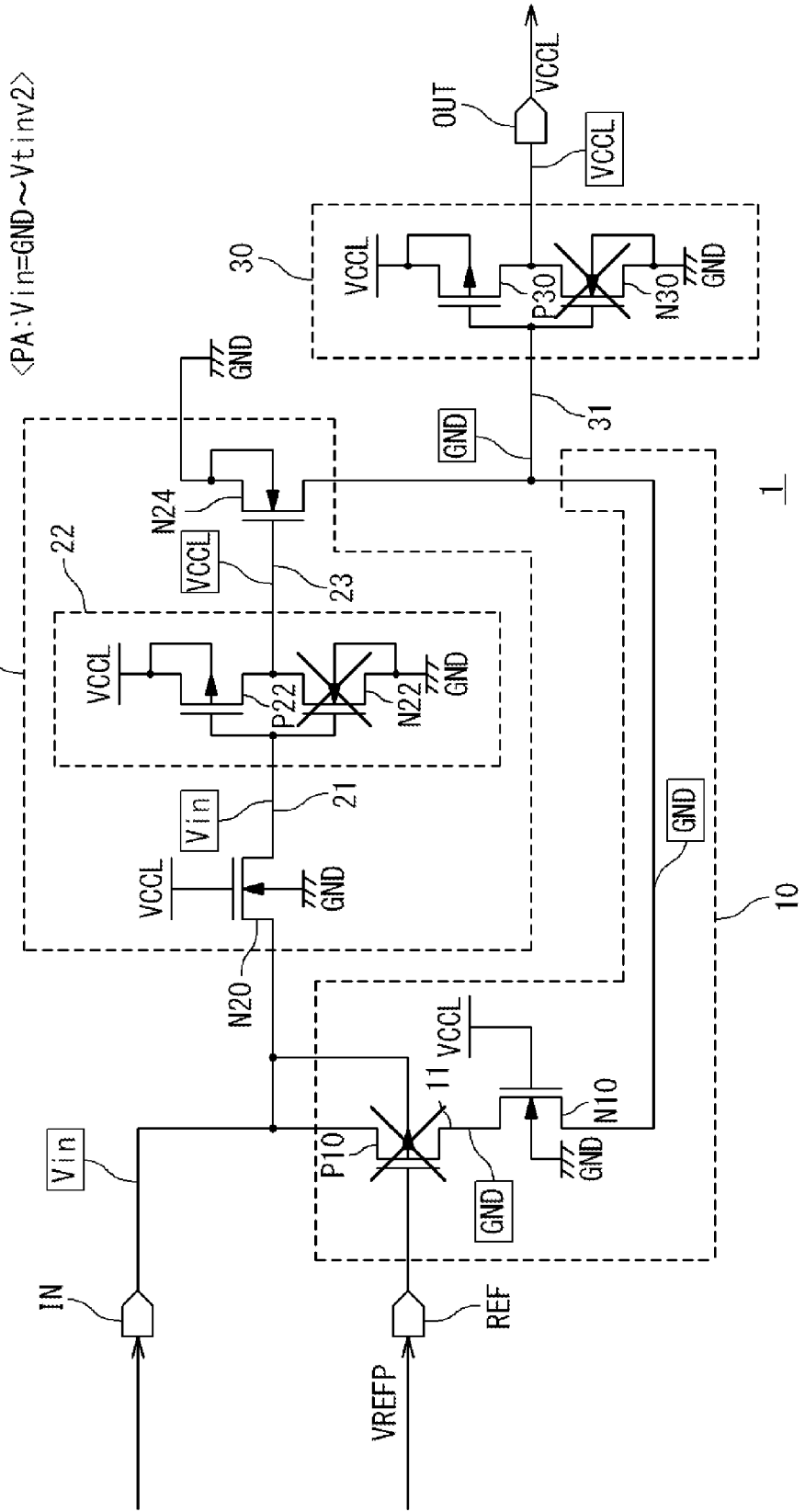

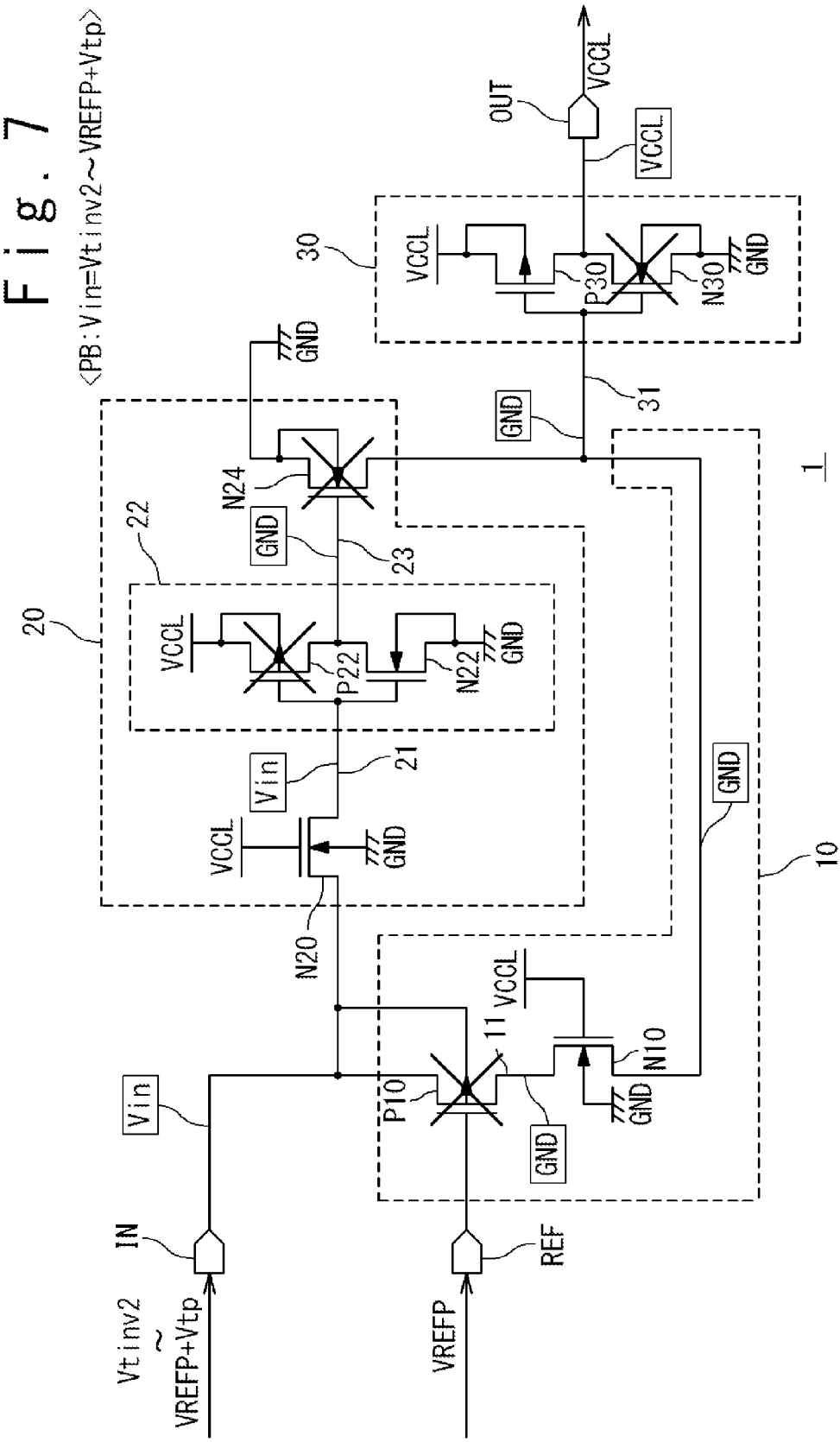

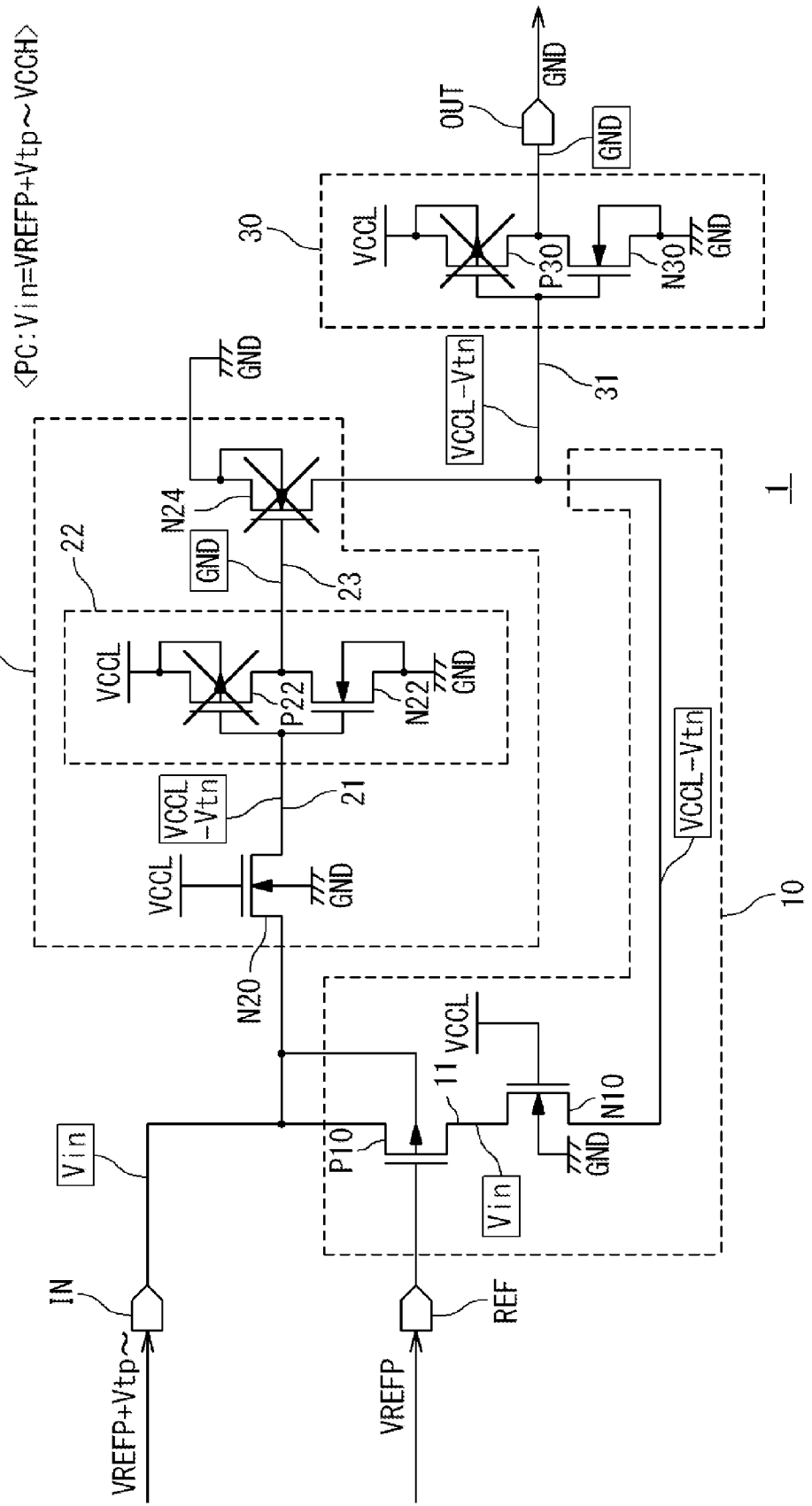

INPUT CIRCUIT

CROSS REFERENCE

This application claims a priority on convention based on Japanese Patent Application JP 2011-232899. The disclosure thereof is incorporated herein by reference.

TECHNICAL FIELD

The present invention is related to an input circuit which converts a high potential signal into a low potential signal.

BACKGROUND ART

Patent Literature 1 (JP 2009-77016A) discloses an input circuit which converts a high potential signal into a low potential signal. Here, the potential level of the high potential signal changes in a range from a ground potential GND to a high power supply potential VCCH, and the potential level of the low potential signal changes in a range from the ground potential GND to a low power supply potential VCCL. The high power supply potential VCCH is higher than the low power supply potential VCCL (VCCH>VCCL). In Patent Literature 1, all of transistors in the input circuit are formed from low withstanding voltage transistors.

Patent Literature 2 (JP 2006-114733A) discloses a trimming resistance. The trimming resistance is provided with a first resistor, a second resistor and a semiconductor switch. The first resistor is formed on a semiconductor substrate to be possible to be trimmed. The second resistor is formed on the semiconductor substrate to be possible to be trimmed. Also, the second resistor is connected with the first resistor and it is possible to configure a synthesized resistance with the first resistor between two terminals. The semiconductor switch is formed on the semiconductor substrate and is connected with the first resistor and the second resistor. The semiconductor switch is used to reduce a resistance value between the two terminals in the on-state less than the resistance value between the two terminals in the off-state.

CITATION LIST

[Patent Literature 1] JP 2009-77016A
[Patent Literature 2] JP 2006-114733A

SUMMARY OF THE INVENTION

Regarding the input circuit which converts a high potential signal into a low potential signal, the following input/output logical relation will be considered as an example. When the potential level of the high potential signal as an input signal is in the high power supply potential VCCH (high), the potential level of the low potential signal as an output signal is in the ground potential GND (low). On the other hand, when the potential level of the high potential signal as the input signal is in the ground potential GND (low), the potential level of the low potential signal as the output signal is in the low power supply potential VCCL (high). When the input signal gradually changes from the low level to the high level or from the high level to the low level, the potential level (logical level) of the output signal is switched at some timing. The potential of the input signal at the timing when this logic inversion occurs is hereinafter referred to as "a target inversion potential".

It is desirable that the target inversion potential is set to an appropriate level (e.g. VCCH/2) to the input signal which varies between the ground potential GND and the high power supply potential VCCH. For example, when the target inversion potential is too low, there is a fear that unexpected logic inversion of the output signal has occurred due to noise applied to the input terminal. Therefore, the target inversion potential is required to have a level of an extent.

It is desired that an input circuit converts a high potential signal to a low potential signal and is operable at an appropriate target inversion potential.

In one viewpoint of the present invention, the input circuit is provided. The input circuit is provided with a ground terminal to which a ground potential is applied, an input terminal which is supplied with an input signal with a potential which varies between the ground potential and a first power supply potential, a first inverter, a first path control circuit and a second path control circuit.

An input of the first inverter is connected with a first node. When the potential of the first node is lower than a first inversion potential, the first inverter outputs a second power supply potential lower than the first power supply potential. On the other hand, when the potential of the first node is higher than the first inversion potential, the first inverter outputs the ground potential. The target inversion potential is higher than the first inversion potential.

The first path control circuit is provided between the input terminal and the first node and controls an electrical connection between the input terminal and the first node according to the potential of the input signal. Specifically, the first path control circuit blocks off the electrical connection between the input terminal and the first node, when the potential of the input signal is lower than the target inversion potential. On the other hand, a first path control circuit connects the input terminal and the first node electrically when the potential of the input signal is higher than the target inversion potential.

The second path control circuit is provided between the ground terminal and the first node and controls the electrical connection between the ground terminal and the first node according to the potential of the input signal. Specifically, the second path control circuit electrically connects the ground terminal and the first node, when the potential of the input signal is lower than a second inversion potential which is lower than the target inversion potential. On the other hand, when the potential of the input signal is higher than the second inversion potential, the second path control circuit blocks off the electrical connection between the ground terminal and the first node.

Moreover, the input circuit according to the present invention may be configured as follows.

Moreover, the input circuit according to the present invention may be provided with a reference terminal to which a reference potential is applied. In this case, the target inversion potential is determined, depending on the reference potential.

The first path control circuit may be provided with a first PMOS transistor. The source, drain and gate of the first PMOS transistor are connected with the input terminal, first node and reference terminal, respectively. In this case, the target inversion potential is equal to a summation of the threshold voltage of the first PMOS transistor and the reference potential.

Moreover, the first path control circuit may be provided with a first NMOS transistor between the drain of the first PMOS transistor and the first node. The second power supply potential is applied to the gate of the first NMOS transistor.

The second path control circuit is provided with a second inverter and a second NMOS transistor. The input and output of the second inverter are connected with the input terminal and a second node, respectively. The second NMOS transistor has a gate connected with the second node, a source connected with the ground terminal and a drain connected with the first node. When the potential of the input signal is lower than the second inversion potential, the second inverter outputs the second power supply potential to the second node and the second NMOS transistor is turned on. On the other hand, when the potential of the input signal is higher than the second inversion potential, the second inverter outputs the ground potential to the second node and the second NMOS transistor is turned off.

Moreover, the second path control circuit may be provided with the third NMOS transistor between the input terminal and the input of the second inverter. The second power supply potential is applied to the gate of the third the NMOS transistor.

The withstanding voltage of the transistors used in the input circuit is lower than the first power supply potential, and higher than the second power supply potential, and above the target inversion potential, and is larger than a difference between the first power supply potential and the second power supply potential.

According to the present invention, the input circuit is realized which converts the high potential signal to the low potential signal and which is operable at an appropriate target inversion potential.

BRIEF DESCRIPTION OF THE DRAWINGS

FIG. 4 is a table showing voltages which are applied to each transistor;

FIG. 5 is a chart showing an operation in a transition state that the potential level of the input signal gradually varies;

FIG. 6 is a circuit diagram showing a condition in a period PA of FIG. 5;

FIG. 7 is a circuit diagram showing a condition in a period PB of FIG. 5; and

FIG. 8 is a circuit diagram showing a condition in a period PC of FIG. 5.

DESCRIPTION OF EMBODIMENTS

Figure 1:
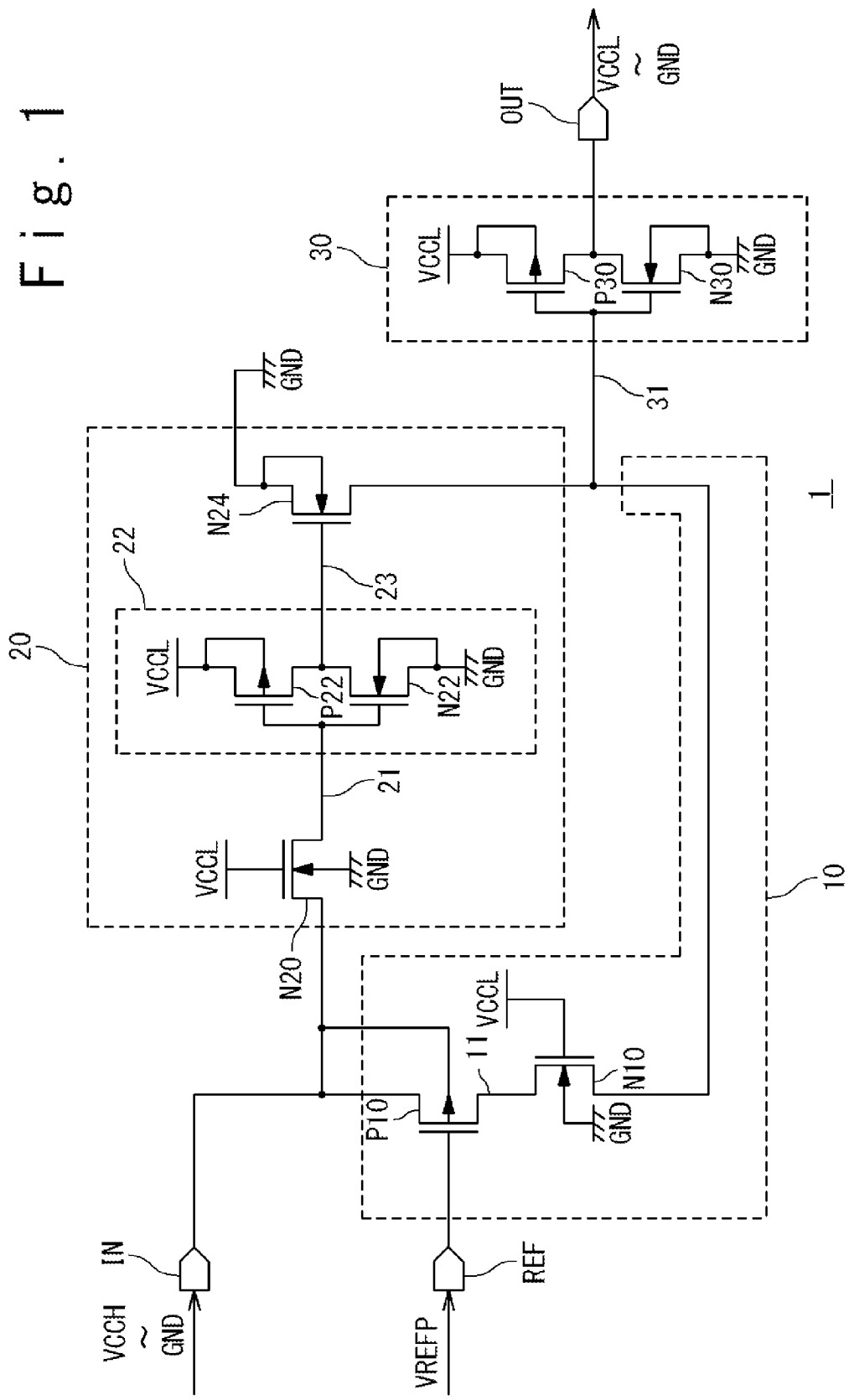
FIG. 1 is a circuit diagram showing a configuration of an input circuit according to an embodiment of the present invention.

Embodiments of the present invention will be described with reference to the attached drawings.
1. Configuration FIG. 1 is a circuit diagram showing a configuration of an input circuit 1 according to an embodiment of the present invention. The input circuit 1 is configured to convert a high potential signal into a low potential signal. In detail, the input circuit 1 is provided with an input terminal IN, an output terminal OUT, a reference terminal REF, a first path control circuit 10, a second path control circuit 20 and an inverter 30 (a first inverter).

A high potential signal is supplied to the input terminal IN as an input signal. The potential level of the input signal changes between a ground potential GND and a high power supply potential VCCH (a first power supply potential). On the other hand, a low potential signal is outputted as an output signal from the output terminal OUT. The potential level of the output signal changes between the ground potential GND and the low power supply potential VCCL (a second power supply potential). The high power supply potential VCCH is higher than the low power supply potential VCCL (VCCH>VCCL). For example, the high power supply potential VCCH is 3.3 V and the low power supply potential VCCL is 1.8 V.

A reference potential VREFP is applied to the reference terminal REF. A "target inversion potential Vth_targ" of the input circuit 1 in the present embodiment is determined according to this the reference potential VREFP, as described in detail later. It should be noted that the target inversion potential Vth_targ is the potential of the input signal at timing when the switching (inversion) of the potential level (logical level) of the output signal occurs.

1-1. First Path Control Circuit 10

The first path control circuit 10 is provided between the input terminal IN and a node 31 (a first node). As mentioned later, the node 31 is connected with the input of the inverter 30. In other words, the first path control circuit 10 forms a first path to the input of the inverter 30. Also, the first path control circuit 10 has a function to control an electrical connection between the input terminal IN and the node 31 according to the potential of the input signal.

In detail, the first path control circuit 10 is provided with a PMOS transistor P10, an NMOS transistor N10 and a node 11.

The source, drain, gate and back gate of the PMOS transistor P10 are connected with the input terminal IN, the node 11, the reference terminal REF and the input terminal IN, respectively. When the threshold voltage of the PMOS transistor P10 is Vtp, the PMOS transistor P10 is turned on if the gate-source voltage become higher than the threshold voltage Vtp. Here, in the present embodiment, the potential of the gate of the PMOS transistor P10 is fixed on the reference potential VREFP. Therefore, the PMOS transistor P10 is turned on when the potential of the source (i.e. the input terminal IN) is equal to or higher than "VREFP+Vtp". On the other hand, when the potential of the input terminal IN is lower than "VREFP+Vtp", the PMOS transistor P10 is turned off so as to be isolated between the source and drain.

In other words, the PMOS transistor P10 plays a role to turn on/off the electrical connection between the input terminal IN and the node 31 based on the potential of the input signal. When the potential of the input signal is lower than "VREFP+Vtp", the PMOS transistor P10 is turned off to prevent the potential of the input signal from being propagated to the node 31. On the other hand, when the potential of the input signal is equal to or higher than "VREFP+Vtp", the PMOS transistor P10 is turned on to permit the potential of the input signal to be propagated to the node 31.

It should be noted that the potential "VREFP+Vtp" is set higher than the ground potential GND and lower than the high power supply potential VCCH (VCCH>VREFP+Vtp>GND). The potential "VREFP+Vtp" is the target inversion potential Vth_targ in the present embodiment, as described later. In other words, the target inversion potential Vth_targ is determined based on the reference potential VREFP.

The source, drain, gate and back gate of the NMOS transistor N10 are connected with the node 31, the node 11, the VCCL terminal and the ground terminal, respectively. The low power supply potential VCCL is applied to the VCCL terminal and the ground potential GND is applied to the ground terminal. In this way, the NMOS transistor N10 is interposed between the node 11 and the node 31 and the low power supply potential VCCL is applied to the gate. When the threshold voltage of the NMOS transistor N10 is Vtn, the source potential of the NMOS transistor N10 is suppressed to "VCCL−Vtn" at maximum. That is, the NMOS transistor N10 plays a role to prevent the high potential from being propagated to the node 31.

1-2. Second Path Control Circuit 20

The second path control circuit 20 is provided between the ground terminal, the input terminal IN and the node 31. In other words, the second path control circuit 20 forms a second path to the input of the inverter 30. Also, the second path control circuit 20 has a function to control the electrical connection between the ground terminal and the node 31 based on the potential of the input signal.

In detail, the second path control circuit 20 is provided with an NMOS transistor N20, a node 21, an inverter 22 (a second inverter), a node 23 (a second node) and an NMOS transistor N24.

The source, drain, gate and back gate of the NMOS transistor N20 are connected with the node 21, the input terminal IN, the VCCL terminal and the ground terminal, respectively. In this way, the NMOS transistor N20 is interposed between the input terminal IN and the node 21, and the low power supply potential VCCL is applied to the gate. Supposing that the threshold voltage of the NMOS transistor N20 is Vtn, the source potential of the NMOS transistor N20 is suppressed to "VCCL−Vtn" at maximum. That is, the NMOS transistor N20 plays a role to prevent the high potential from being propagated to the node 21.

The input and output of the inverter 22 are connected with the node 21 and the node 23, respectively. In detail, the inverter 22 is provided with a PMOS transistor P22 and an NMOS transistor N22. The source, drain, gate and back gate of the PMOS transistor P22 are connected with the VCCL terminal, the node 23, the node 21 and the VCCL terminal, respectively. The source, drain, gate and back gate of the NMOS transistor N22 are connected with the ground terminal, the node 23, the node 21 and the ground terminal, respectively.

The inversion potential of the inverter 22 is Vtinv2 (e.g. VCCL/2). When the potential of the node 21 is lower than the inversion potential Vtinv2, the PMOS transistor P22 is turned on and the NMOS transistor N22 is turned off, and as the result, the inverter 22 outputs the low power supply potential VCCL to the node 23. On the other hand, when the potential of the node 21 is equal to or higher than the inversion potential Vtinv2, the NMOS transistor N22 is turned on and the PMOS transistor P22 is turned off, and as the result, the inverter 22 outputs the ground potential GND to the node 23.

The source, drain, gate and back gate of the NMOS transistor N24 are connected with the ground terminal, the node 31, the node 23 and the ground terminal, respectively. When the potential of the node 23 is equal to the low power supply potential VCCL, the NMOS transistor N24 is turned on so that the node 31 is electrically connected with the ground terminal. On the other hand, when the potential of the node 23 is equal to the ground potential GND, the NMOS transistor N24 is turned off and the electrical connection between the node 31 and the ground terminal is blocked off. The potential of the node 23 is equal to the output potential of the inverter 22 and the output potential of the inverter 22 depends on the potential of the input terminal IN. Therefore, it is possible to say that the NMOS transistor N24 controls the electrical connection between the ground terminal and the node 31 according to the potential of the input signal.

1-3. Inverter 30

The inverter 30 is a buffer and the input and output thereof are connected with the node 31 and the output terminal OUT, respectively. In detail, the inverter 30 is provided with a PMOS transistor P30 and an NMOS transistor N30. The source, drain, gate and back gate of the PMOS transistor P30 are connected with the VCCL terminal, the output terminal OUT, the node 31 and the VCCL terminal, respectively. The source, drain, gate and back gate of the NMOS transistor N30 are connected with the ground terminal, the output terminal OUT, the node 31 and the ground terminal, respectively.

The inversion potential of the inverter 30 is Vtinv1 (e.g. VCCL/2). When the potential of the node 31 is lower than the inversion potential Vtinv1, the PMOS transistor P30 is turned on and the NMOS transistor N30 is turned off, and as the result, the inverter 30 outputs the low power supply potential VCCL to the output terminal OUT. On the other hand, when the potential of the node 31 is equal to or higher than the inversion potential Vtinv1, the PMOS transistor P30 is turned off and the NMOS transistor N30 is turned on, and as the result, the inverter 30 outputs the ground potential GND to the output terminal OUT.

2. Steady State and Withstanding Voltage 2-1. In Case of IN=Low

Figure 2:
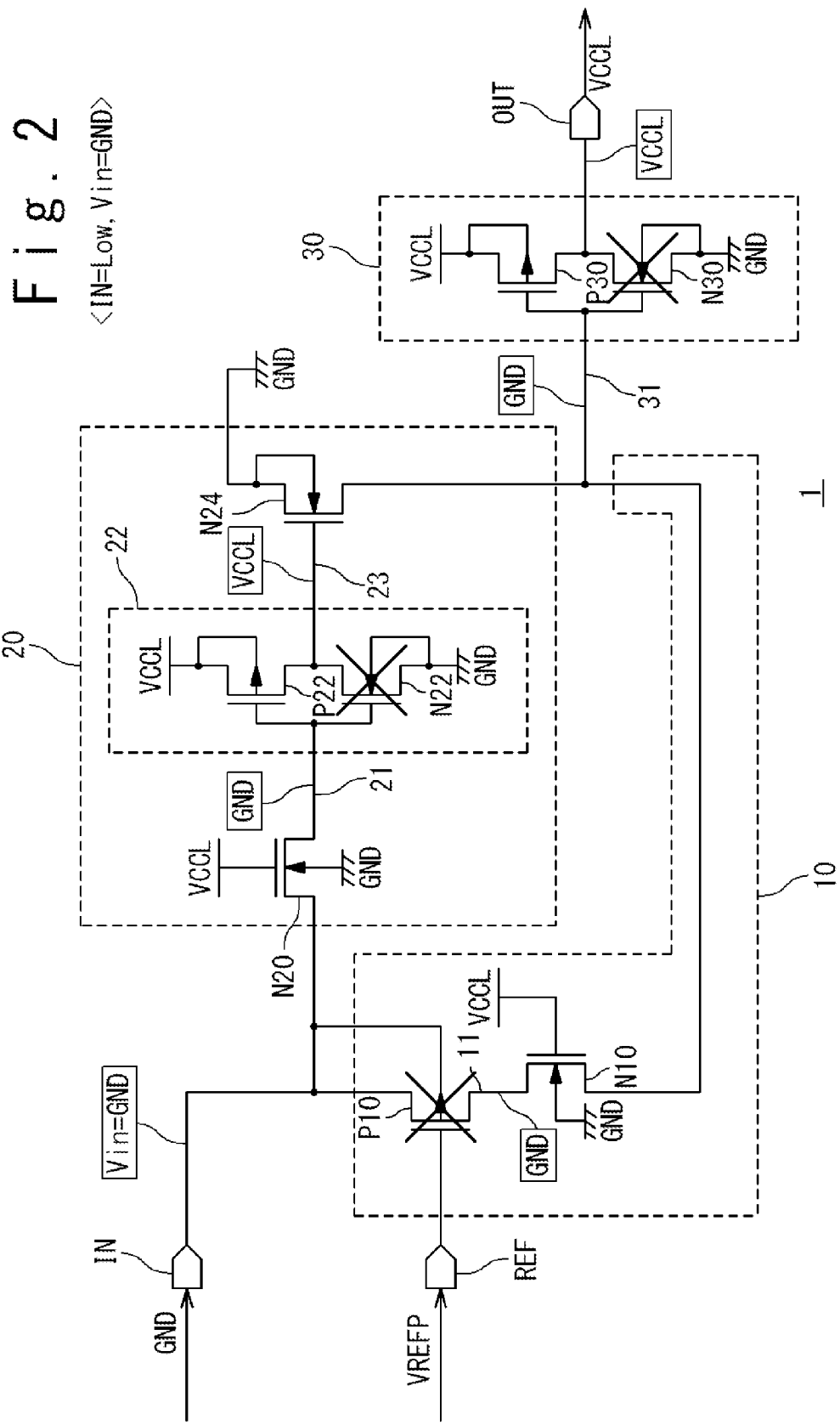
FIG. 2 is a circuit diagram showing a condition when an input signal is in a low level.

FIG. 2 shows a condition when the input signal is in a low level. In this case, the potential Vin of the input signal is equal to the ground potential GND.

The condition of the first path control circuit 10 is as follows. Because the input potential Vin=GND is lower than the above-mentioned potential "VREFP+Vtp", the PMOS transistor P10 is turned off. As a result, the electrical connection between the input terminal IN and the node 31 is blocked off.

On the other hand, the condition of the second path control circuit 20 is as follows. The potential of the node 21 is in the ground potential GND and is lower than the inversion potential Vtinv2 of the inverter 22. Therefore, the PMOS transistor P22 is turned on, and the NMOS transistor N22 is turned off, and the inverter 22 outputs the low power supply potential VCCL to the node 23. Because the potential of the node 23 is equal to the low power supply potential VCCL, the NMOS transistor N24 is turned on. In other words, the second path control circuit 20 electrically connects the ground terminal and the node 31.

The condition of the inverter 30 is as follows. The potential of the node 31 is equal to the ground potential GND. The PMOS transistor P30 is turned on and the NMOS transistor N30 is turned off, and the inverter 30 outputs the low power supply potential VCCL to the output terminal OUT. In other words, the output signal of the high level is outputted from the output terminal OUT.

2-2. In Case of IN=High

Figure 3:
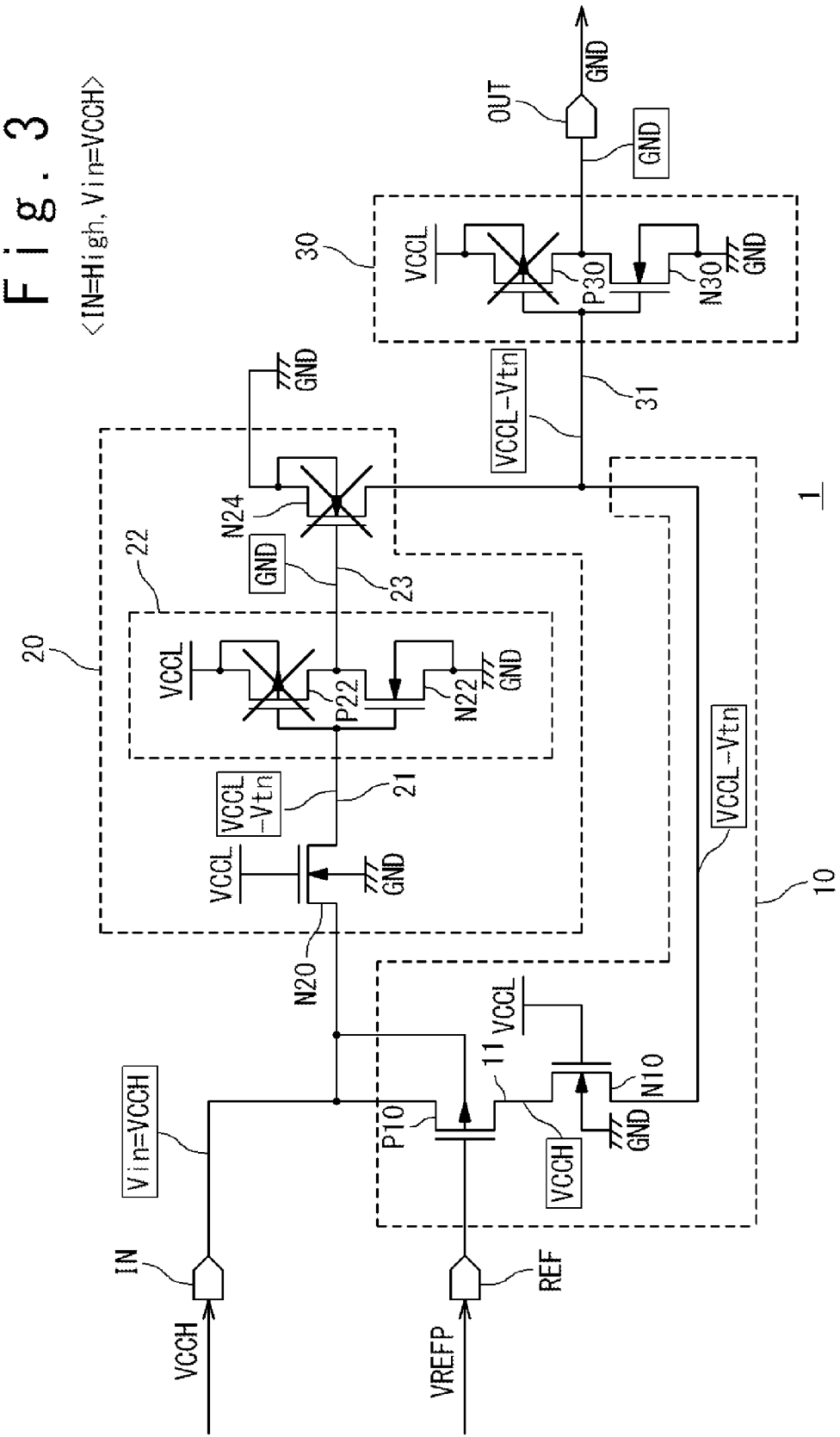
FIG. 3 is a circuit diagram showing a condition when the input signal is in a high level.

FIG. 3 shows a condition when the input signal is in the high level. In this case, the potential Vin of the input signal is in the high power supply potential VCCH.

The condition of the first path control circuit 10 is as follows. Because the input potential Vin=VCCH is higher than the above-mentioned potential "VREFP+Vtp", the PMOS transistor P10 is turned on. Thus, the input terminal IN and the node 31 are electrically connected. The potential of the node 11 is set to the high power supply potential VCCH. The source potential of the NMOS transistor N10, i.e. the potential of the node 31 becomes equal to "VCCL−Vtn".

On the other hand, the condition of the second path control circuit 20 is as follows. The potential of the node 21 is in the source potential of the NMOS transistor N20 and is equal to "VCCL−Vtn". It is supposed that the potential "VCCL−Vtn" is higher than the inversion potential Vtinv2 of the inverter 22. In this case, the PMOS transistor P22 is turned off and the NMOS transistor N22 is turned on, and the inverter 22 outputs the ground potential GND to the node 23. Because the potential of the node 23 is equal to the ground potential GND, the NMOS transistor N24 is turned off. In other words, the second path control circuit 20 blocks off the electrical connection between the node 31 and the ground terminal.

The condition of the inverter 30 is as follows. The potential of the node 31 is "VCCL−Vtn". It is supposed that the potential "VCCL−Vtn" is higher than the inversion potential Vtinv1 of the inverter 30. In this case, the PMOS transistor P30 is turned off and the NMOS transistor N30 is turned on, and the inverter 30 outputs the ground potential GND to the output terminal OUT. In other words, the output signal of the low level is outputted from the output terminal OUT.

2-3. Withstanding Voltage

FIG. 4 shows a voltage applied to each transistor in each condition shown in FIG. 2 and FIG. 3. "Vgd" is a gate-drain voltage (potential difference), "Vgs" is a gate-source voltage (potential difference), and "Vds" is a drain-source voltage (potential difference). When the withstanding voltage of each transistor is Vb, it is sufficient for the withstanding voltage Vb to satisfy the following conditions.

Vb>VREFP
Vb>VCCL
Vb>VCCH−VREFP
Vb>VCCH−VCCL
Vb>VCCH−(VCCL−Vtn)

A case that VCCH=3.3V, VCCL=1.8V, VREFP=1.5V, and VCCL−Vtn=1.55 V will be considered as an example. In this case, the withstanding voltage Vb should satisfy the following conditions.

Vb>VREFP=1.5V
Vb>VCCL=1.8V
Vb>VCCH−VREFP=3.3V−1.5V=1.8V
Vb>VCCH−VCCL=3.3V−1.8V=1.5V
Vb>VCCH−(VCCL−Vtn)=3.3V−1.55V=1.75V

Therefore, considering the conditions shown in FIG. 2 and FIG. 3, the withstanding voltage Vb of each transistor is sufficient if being higher than 1.8 V at least. Saying oppositely, the high level as much as the high power supply potential VCCH is unnecessary as the withstanding voltage Vb. In other words, in the present embodiment, the withstanding voltage Vb of each transistor can be made lower than the high power supply potential VCCH (VCCH>Vb). This means that all the transistors in the input circuit 1 can be configured from "the low withstanding voltage transistors". That is, according to the present embodiment, the input circuit 1 which handles the high power supply potential VCCH can be configured only with the low withstanding voltage transistors. Therefore, a manufacturing cost is reduced.

3. Transition Condition

Next, the transition condition in which the potential Vin of the input signal changes gradually is considered. As an example, a case where the potential Vin of the input signal gradually changes from the ground potential GND to the high power supply potential VCCH in the power on will be considered.

FIG. 5 is a diagram showing an operation when the potential Vin of the input signal gradually changes from the ground potential GND to the high power supply potential VCCH. In FIG. 5, the horizontal axis shows the potential Vin of the input signal (the input terminal IN) and the vertical axis shows the potential of each of the nodes 11, 23, 31 and the output terminals OUT. It should be noted that each potential is obtained through the SPICE simulation. In the SPICE simulation, the setting is carried out in such a manner that VCCH=3.3 V, VCCL=1.8 V, VREFP+Vtp=1.7 V, and Vtinv1=Vtinv2=VCCL/2=0.9 V. It should be noted that the potential "VREFP+Vtp" is higher than the inversion potentials Vtinv1 and Vtinv2 of the inverters 30 and 22 (VREFP+ Vtp>Vtinv1, Vtinv2). As the input potential Vin changes, the following three different periods PA, PB, and PC appear in order.

3-1. Period PA: Vin=from GND to Vtinv2

In the period PA, the input potential Vin is equal to or higher than the ground potential GND and is lower than the inversion potential Vtinv2 (=0.9V) of the inverter 22. FIG. 6 shows a condition in this period PA.

The condition of the first path control circuit 10 is as follows. Because the input potential Vin is lower than the potential "VREFP+Vtp=1.7V", the PMOS transistor P10 is turned off. In other words, the first path control circuit 10 blocks off the electrical connection between the input terminal IN and the node 31.

On the other hand, the condition of the second path control circuit 20 is as follows. The potential of the node 21 is in the input potential Vin and is lower than the inversion potential Vtinv2 of the inverter 22. The PMOS transistor P22 is turned on and the NMOS transistor N22 is turned off and the inverter 22 outputs the low power supply potential VCCL to the node 23. Because the potential of the node 23 is equal to the low power supply potential VCCL, the NMOS transistor N24 is turned on. In other words, the second path control circuit 20 electrically connects the ground terminal and the node 31 and the potential of the node 31 is maintained to the ground potential GND.

The condition of the inverter 30 is as follows. The potential of the node 31 is in the ground potential GND. The PMOS transistor P30 is turned on and the NMOS transistor N30 is turned off and the inverter 30 outputs the low power supply potential VCCL (=1.8V) to the output terminal OUT. In other words, the output signal of the high level is outputted from the output terminal OUT.

3-2. Period PB: Vin=from Vtinv2 to VREFP+Vtp

In the period PB, the input potential Vin is equal to or higher than the inversion potential Vtinv2 (=0.9V) of the inverter 22 and is lower than the potential "VREFP+ Vtp=1.7V". FIG. 7 shows a condition in this period PB.

The condition of the first path control circuit 10 is as follows. Because the input potential Vin is lower than the potential "VREFP+Vtp=1.7V", the PMOS transistor P10 is turned off. In other words, the first path control circuit 10 blocks off the electrical connection between the input terminal IN and the node 31.

On the other hand, the condition of the second path control circuit 20 is as follows. The potential of the node 21 is in the input potential Vin and is equal to or higher than the inversion potential Vtinv2 of the inverter 22. The PMOS transistor P22 is turned off and the NMOS transistor N22 is turned on and the inverter 22 outputs the ground potential GND to the node 23. In other words, on transiting from the period PA to the period PB, the potential of the node 23 changes from the low power supply potential VCCL to the ground potential GND. The NMOS transistor N24 is turned off in response to this transition. In other words, the second path control circuit 20 blocks off the electrical connection between the node 31 and the ground terminal. At this time, the node 31 is set to a floating condition.

Because there is not any potential supply path to the node 31 although the node 31 is set to the floating condition, the potential of the node 31 is maintained in the ground potential GND. Therefore, the output signal outputted from the output terminal OUT does not change and is maintained in the high level. Here, in the result of the SPICE simulation shown in FIG. 5, the potential of the node 31 becomes about 0.2 V in the period PB. Because this potential (=0.2V) does not exceed the inversion potential Vtinv1 (=0.9V) of the inverter 30, the output signal is not still inverted.

3-3. Period PC: Vin=from VREFP+Vtp to VCCH

In the period PC, the input potential Vin is equal to or higher than the potential "VREFP+Vtp=1.7V". FIG. 8 shows a condition in this period PC.

When the input potential Vin becomes the potential "VREFP+Vtp", the PMOS transistor P10 is turned on. At this time, there is a possibility that the potential difference of "VREFP+Vtp" is applied between the source and the drain in the PMOS transistor P10 in maximum. Therefore, it is desirable that the withstanding voltage Vb of the PMOS transistor P10 is equal to or higher than "VREFP+Vtp".

Because the PMOS transistor P10 is turned on, the input terminal IN and the nodes 11 and 31 are electrically connected. In other words, the first path control circuit 10 electrically connects the input terminal IN and the node 31. Thus, the potentials of the nodes 11 and 31 rise. Here, the potential "VREFP+Vtp" is higher than the inversion potential Vtinv1 of the inverter 30 (VREFP+Vtp>Vtinv1). Therefore, the PMOS transistor P30 is turned off and the NMOS transistor N30 is turned on and the inverter 30 outputs the ground potential GND to the output terminal OUT. In other words, the potential level (the logical level) of the output signal is inverted and the output signal of the low level is outputted from the output terminal OUT.

The potential of the node 11 rises according to the input potential Vin, after becoming equal to the input potential Vin. The potential of the node 31, too, rises but the upper limit is "VCCL−Vtn". The potential "VCCL−Vtn" is also higher than the inversion potential Vtinv1 of the inverter 30 (VCCL−Vtn>Vtinv1).

The condition of the second path control circuit 20 is as follows. The potential of the node 21 rises, following the input potential Vin, but the upper limit is "VCCL−Vtn". The potential "VCCL−Vtn" is higher than the inversion potential Vtinv2 of the inverter 22. Therefore, the PMOS transistor P22 is turned off and the NMOS transistor N22 is turned on, and the inverter 22 outputs the ground potential GND to the node 23. Because the potential of the node 23 is in the ground potential GND, the NMOS transistor N24 is turned off. In other words, the second path control circuit 20 blocks off the electrical connection between the node 31 and the ground terminal.

It should be noted that the NMOS transistor N24 is already turned off since the above-mentioned period PB, that is, before the PMOS transistor P10 is turned on. Therefore, the occurrence of the passing-through current when the PMOS transistor P10 is turned on is perfectly prevented.

In this way, when the input signal changes from the low level to the high level, the logic of the output signal is inverted if the input potential Vin rises to "VREFP+Vtp". That is, the target inversion potential Vth_targ (the first target inversion potential) is "VREFP+Vtp". This target inversion potential Vth_targ=VREFP+Vtp is higher than the inversion potential Vtinv1 of the inverter 30 and is lower than the high power supply potential VCCH. Desirably, the target inversion potential Vth_targ is set to VCCH/2. The setting of the target inversion potential Vth_targ is possible by adjusting the reference potential VREFP.

It should be noted that when the input signal changes from the high level to the low level, the logic of the output signal is inverted if the input signal Vin falls to "Vtinv2". That is, the target inversion potential Vth_targ (the second target inversion potential) is "Vtinv2". The target inversion potential Vth_targ is different between a case that the input signal changes from the low level to the high level (the first target inversion potential) and a case that the input signal changes from the high level to the low level (the second target inversion potential). That is, the target inversion potential Vth_targ has a hysteresis characteristic but there is no problem on the operation. Also, because the noise for difference potential "VREFP+Vtp"−"Vtinv2" can be filtered, the noise tolerance is further improved.

4. Effects

As described above, according to the present embodiment, the two path control circuits are provided to control the potential of the input node 31 of the inverter 30: the first circuit is the first path control circuit 10 provided between the input terminal IN and the node 31, and the second circuit is a second path control circuit 20 provided between the ground terminal and the node 31.

When the input potential Vin changes from the ground potential GND to the high power supply potential VCCH, the first path control circuit 10 prevents the input potential Vin from being propagated to the node 31 and the second path control circuit 20 maintains the potential of the node 31 to the ground potential GND or the neighborhood, while the input potential Vin is lower than the target inversion potential Vth_targ. In this case, the logic inversion of the output signal does not occur. When the input potential Vin becomes higher than the target inversion potential Vth_targ, the first path control circuit 10 starts the supply of input potential Vin to the node 31 and the second path control circuit 20 isolates the node 31 from the ground terminal. This causes the logic inversion of the output signal.

In this way, the logic inversion in the target inversion potential Vth_targ which is higher than the inversion potential Vtinv1 of the inverter 30 is realized. In other words, the input circuit 1 operable at the target inversion potential Vth_targ which is somewhat higher can be realized. As a result, it is prevented that the unexpected logic inversion of the output signal occurs due to noise applied to the input terminal IN. In other words, the noise tolerance is improved.

Also, according to the present embodiment, the target inversion potential Vth_targ is given as "VREFP+Vtp". It is possible to set the target inversion potential Vth_targ to a desirable value by setting the reference potential VREFP appropriately. For example, the target inversion potential Vth_targ can be set to the neighborhood of VCCH/2. It should be noted that it is possible to variably set the reference potential VREFP, i.e. the target inversion potential Vth_targ according to an operation mode.

Moreover, according to the present embodiment, the input circuit 1 which handles the high power supply potential VCCH can be configured from only the transistors having low withstanding voltages. Considering both of the above-mentioned steady state and transition state, the withstanding voltage Vb of each transistor in the input circuit 1 should satisfy the following conditions.

Vb>VREFP
Vb>VCCL
Vb>VCCH−VREFP
Vb>VCCH−VCCL
Vb>VCCH−(VCCL−Vtn)
Vb≧VREFP+Vtp=Vth_targ A case that VCCH=3.3 V, VCCL=1.8 V, VREFP=1.5 V, VCCL−Vtn=1.55 V, and Vth_targ=1.7 V is considered as an example. In this case, the withstanding voltage Vb should satisfy the following conditions:

Vb>VREFP=1.5V
Vb>VCCL=1.8V
Vb>VCCH−VREFP=3.3V−1.5V=1.8V
Vb>VCCH−VCCL=3.3V−1.8V=1.5V

Vb>VCCH−(VCCL−Vtn)=3.3V−1.55V=1.75V
Vb≧VREFP+Vtp=Vth_targ=1.7V

Therefore, the withstanding voltage Vb of each transistor is sufficient if it is higher than 1.8 V at least. Saying oppositely, the high level as much as the high power supply potential VCCH is unnecessary as the withstanding voltage Vb. In other words, in the present embodiment, the withstanding voltage Vb of each transistor can be made lower than the high power supply potential VCCH (VCCH>Vb). This means that all the transistors in the input circuit 1 can be configured from "the low withstanding voltage transistors". Even if they are the low withstanding voltage transistors, they meet the conditions of the withstanding voltage Vb in both of the steady state and the transition state. By configuring the input circuit 1 by only the low withstanding voltage transistors, a manufacturing cost can be reduced.

For example, the input circuit 1 according to the present embodiment can be applied to an input interface of a semiconductor integrated circuit.

As described above, the embodiments of the present invention have been described with reference to the attached drawings. But, the present invention is not limited to the above-mentioned embodiments and can be appropriately changed by a skilled person in a range which does not deviate from a point.

What is claimed is:

1. An input circuit comprising:
a ground terminal to which a ground potential is applied;
an input terminal to which an input signal with a potential which varies between the ground potential and a first power supply potential is supplied;
a first inverter having an input connected with a first node;
a first path control circuit provided between said input terminal and said first node and configured to control an electrical connection between said input terminal and said first node based on the potential of the input signal; and
a second path control circuit provided between said ground terminal and said first node and configured to control an electrical connection between said ground terminal and said first node based on the potential of the input signal,
wherein said first inverter outputs a second power supply potential which is lower than the first power supply potential, when the potential of said first node is lower than a first inversion potential, and outputs the ground potential when the potential of said first node is higher than the first inversion potential,
wherein a target inversion potential is higher than the first inversion potential,
wherein said first path control circuit blocks off the electrical connection between said input terminal and said first node when the potential of the input signal is lower than the target inversion potential, and electrically connects said input terminal and said first node, when the potential of the input signal is higher than the target inversion potential, and
wherein said second path control circuit electrically connects said ground terminal and said first node when the potential of the input signal is lower than the second inversion potential which is lower than the target inversion potential, and blocks off the electrical connection between said ground terminal and said first node when the potential of the input signal is higher than the second inversion potential.

2. The input circuit according to claim 1, further comprising:
a reference terminal to which a reference potential is applied,
wherein the target inversion potential is determined based on the reference potential.

3. The input circuit according to claim 2, wherein said first path control circuit comprises a first PMOS transistor,
wherein a source, a drain and a gate of said first PMOS transistor are connected with said input terminal, said first node and said reference terminal, respectively, and
wherein the target inversion potential is equal to a summation of a threshold voltage of said first PMOS transistor to the reference potential.

4. The input circuit according to claim 3, wherein said first path control circuit further comprises a first NMOS transistor which is interposed between said drain of said first PMOS transistor and said first node, and
wherein the second power supply potential is applied to said gate of said first NMOS transistor.

5. The input circuit according to claim 1, wherein said second path control circuit comprises:
a second inverter having an input connected with said input terminal, and an output connected with a second node; and
a second NMOS transistor having a gate connected with said second node, a source connected with said ground terminal and a drain connected with said first node,
wherein, when the potential of the input signal is lower than the second inversion potential, said second inverter outputs the second power supply potential to said second node and said second NMOS transistor is turned on, and
wherein, when the potential of the input signal is higher than the second inversion potential, said second inverter outputs the ground potential to said second node and said second NMOS transistor is turned off.

6. The input circuit according to claim 5, wherein said second path control circuit further comprises a third NMOS transistor interposed between said input terminal and said input of said second inverter, and
wherein said second power supply potential is applied to a gate of said third NMOS transistor.

7. The input circuit according to claim 1, wherein a withstanding voltage of the transistor which is used in said input circuit is lower than the first power supply potential and higher than the second power supply potential, and is above the target inversion potential and is larger than a difference between the first power supply potential and the second power supply potential.

* * * * *